United States Patent
Lu et al.

(10) Patent No.: US 11,653,448 B2
(45) Date of Patent: May 16, 2023

(54) CIRCUIT BOARD MODULE AND ELECTRONIC DEVICE

(71) Applicant: Fulian Precision Electronics (Tianjin) Co., LTD., Tianjin (CN)

(72) Inventors: Wen-Hu Lu, Tianjin (CN); Li-Yi Yin, Tianjin (CN); Shu-Tong Wang, Tianjin (CN); Nan Du, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 113 days.

(21) Appl. No.: 17/230,320

(22) Filed: Apr. 14, 2021

(65) Prior Publication Data

US 2021/0329785 A1 Oct. 21, 2021

(30) Foreign Application Priority Data

Apr. 16, 2020 (CN) .......................... 202010302167.9

(51) Int. Cl.
*H05K 1/14* (2006.01)
*H05K 5/00* (2006.01)

(52) U.S. Cl.
CPC .......... *H05K 1/145* (2013.01); *H05K 5/0026* (2013.01); *H05K 2201/042* (2013.01)

(58) Field of Classification Search
CPC . H05K 1/145; H05K 5/0026; H05K 2201/042
See application file for complete search history.

(56) References Cited

U.S. PATENT DOCUMENTS

| 8,721,350 | B2 * | 5/2014 | Liu | H01R 12/73 439/74 |
| 2013/0048343 | A1 * | 2/2013 | Zhou | G06F 1/186 174/250 |
| 2013/0322027 | A1 * | 12/2013 | Yang | G06F 1/16 361/736 |
| 2015/0234127 | A1 * | 8/2015 | Paul Chen | H05K 3/301 385/61 |
| 2018/0248285 | A1 * | 8/2018 | Rishworth | H01R 12/7082 |
| 2019/0243075 | A1 * | 8/2019 | Chan | G02B 6/3897 |

FOREIGN PATENT DOCUMENTS

CN 203194019 U 9/2013
TW M461962 U1 9/2013

* cited by examiner

*Primary Examiner* — Hoa C Nguyen
(74) *Attorney, Agent, or Firm* — ScienBiziP, P.C.

(57) ABSTRACT

A circuit board module includes a first circuit board, a second circuit board facing the first circuit board, a connecting device fixed between the first circuit board and the second circuit board, and an adapter board fixed to the connecting device and disposed between the first circuit board and the second circuit board. The adapter board is inserted into the first circuit board and the second circuit board.

16 Claims, 6 Drawing Sheets

CIRCUIT BOARD MODULE AND ELECTRONIC DEVICE

FIELD

The subject matter herein generally relates to a circuit board module and an electronic device having the circuit board module.

BACKGROUND

For data transmission between two circuit boards, an adapter board needs to be inserted into slots of the two circuit boards to establish electrical conduction therebetween. However, due to fragile materials of the adapter board and the circuit boards, the adapter board and the circuit boards may be easily damaged when the adapter board is removed from the slots.

BRIEF DESCRIPTION OF THE DRAWINGS

Implementations of the present disclosure will now be described, by way of embodiment, with reference to the attached figures.

DETAILED DESCRIPTION

Figure 1:
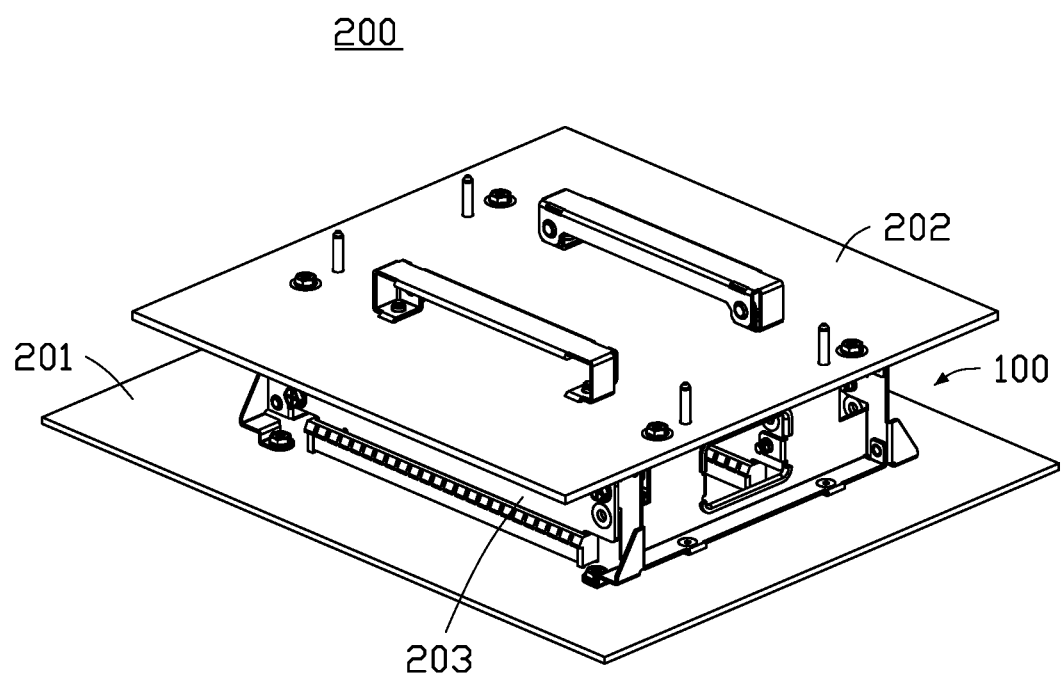
FIG. 1 is a diagrammatic view of an embodiment of a circuit board module according to the present disclosure.
Figure 2:
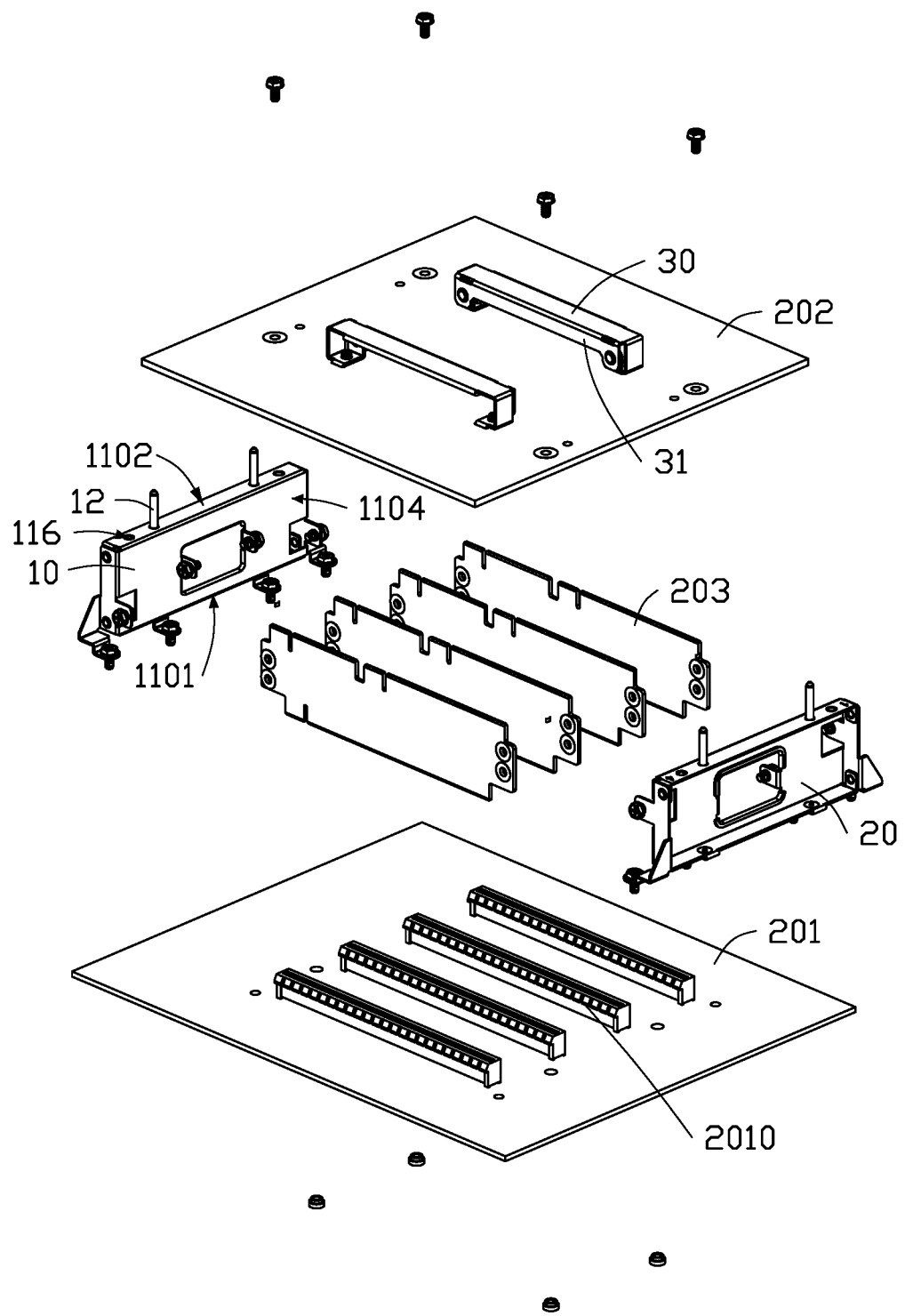
FIG. 2 is an exploded view of the circuit board module of FIG. 1.

Implementations of the disclosure will now be described, by way of embodiments only, with reference to the drawings. It should be noted that the embodiments and the features of the present disclosure can be combined without conflict. Specific details are set forth in the following description to make the present disclosure to be fully understood. The embodiments are only portions of, but not all the embodiments of the present disclosure. Based on the embodiments of the present disclosure, other embodiments obtained by a person of ordinary skill in the art without creative efforts shall be within the scope of the present disclosure.

Unless defined otherwise, all technical and scientific terms used herein have the same meaning as commonly understood by one of ordinary skill in the art. The terms used herein in the specification of the present disclosure are only for describing the embodiments and are not intended to limit the present disclosure. The term "and/or" as used herein includes any combination of one or more related items.

FIGS. 1 to 4 illustrate an embodiment of a circuit board module 200, which includes a first circuit board 201, a second circuit board 202, an adapter board 203, and a connecting device 100. In at least one embodiment, the connecting device 100 includes a first connecting bracket 10, a second connecting bracket 20, and at least one grabbing member 30. Each of the first connecting bracket 10 and the second connecting bracket 20 is fixed between the first circuit board 201 and the second circuit board 202. The first connecting bracket 10 and the second connecting bracket 20 face each other. In at least one embodiment, each of the first connecting bracket 10 and the second connecting bracket 20 includes a connecting body 11. The connecting body 11 can be substantially a hollow rectangle. The connecting body 11 includes a first side 1101, a second side 1102, a first surface 1103, and a second surface 1104. The first side 1101 and the second side 1102 are opposite to each other. The first surface 1103 and the second surface 1104 are opposite to each other. Each of the first connecting bracket 10 and the second connecting bracket 20 is fixed to the first circuit board 201 through the first side 1101. Each of the first connecting bracket 10 and the second connecting bracket 20 is fixed to the second circuit board 202 through the second side 1102.

The adapter board 203 is fixed between the first connecting bracket 10 and the second connecting bracket 20, and is inserted into a first slot 2010 of the first circuit board 201 and a second slot (not shown) of the second circuit board 202.

Figure 3:
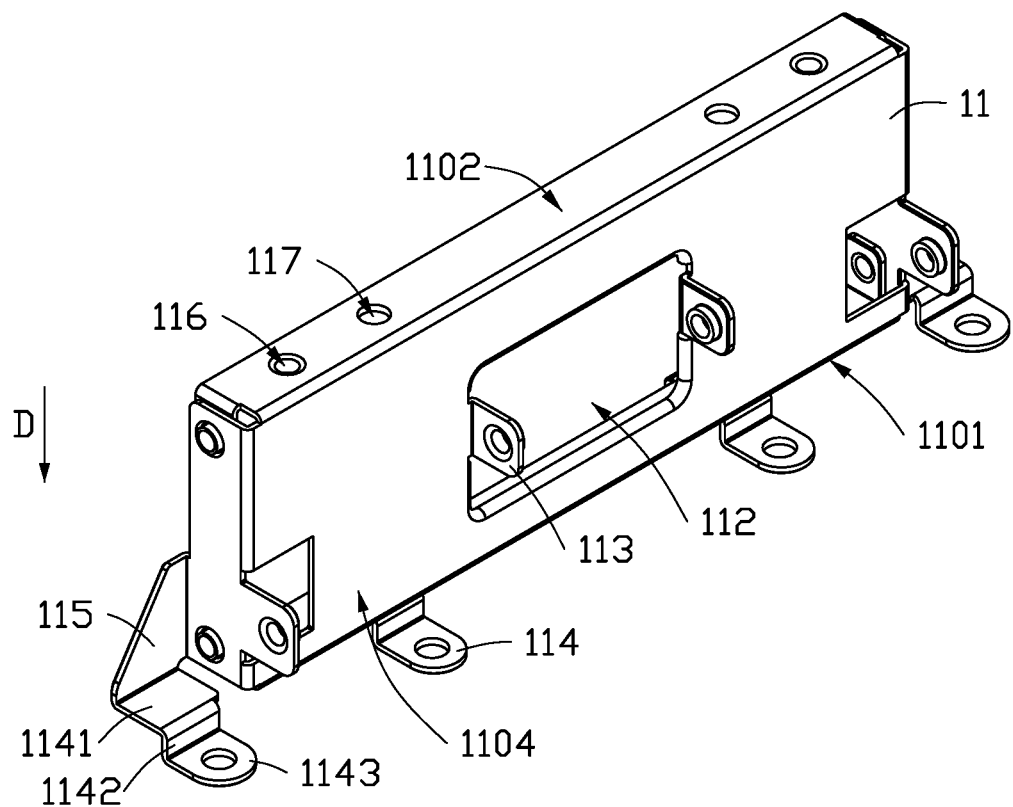
FIG. 3 is a diagrammatic view of a first connecting bracket of the circuit board module of FIG. 1.
Figure 4:
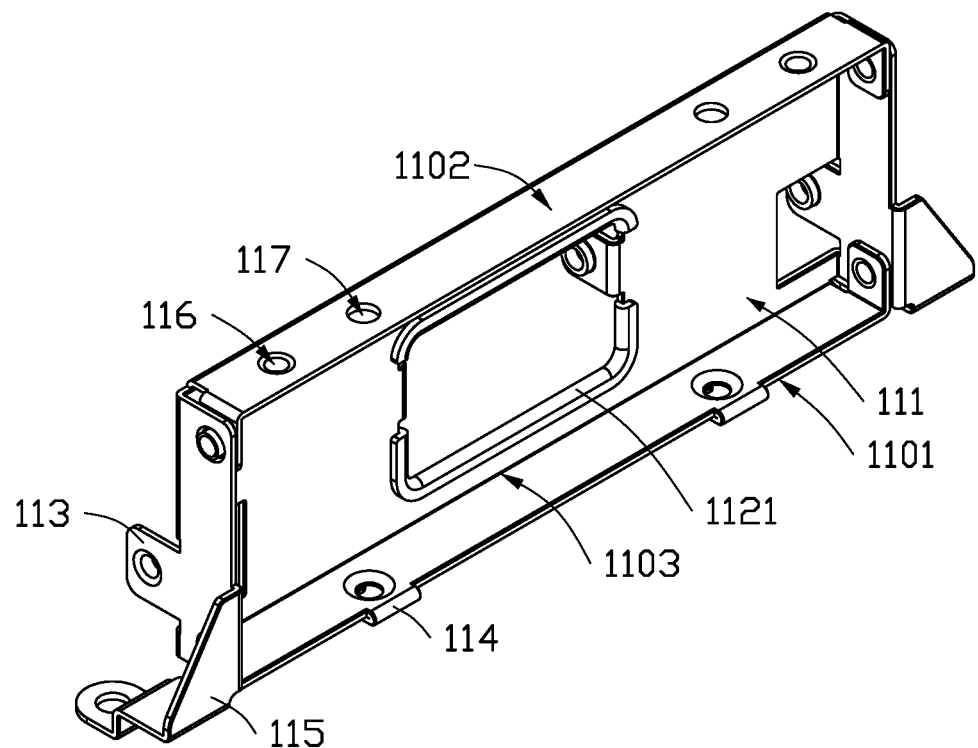
FIG. 4 is similar to FIG. 3, but showing the first connecting bracket from another angle.

Referring to FIGS. 3 and 4, the first connecting bracket 10 further includes at least one guiding post 12 disposed on the second side 1102 of the connecting body 11. The first surface 1103 of the connecting body 11 is recessed towards the second surface 1104 to form a recess region 111.

A bottom of the recess region 111 defines an opening 112 that penetrating the second surface 1104. As such, a user can grab the first connecting bracket 10 at the opening 112, thus facilitating the installation of the adapter board 203 connecting to the first connecting bracket 10 to the first circuit board 201, and also the detachment of the adapter board 203 from the first circuit board 201. Thus, it can prevent an external force from damaging the first circuit board 201 and the adapter board 203.

In at least one embodiment, a flange 1121 extend from an inner wall of the opening 112 towards the first surface 1103, which increases an area for grabbing the first connecting bracket 10. Furthermore, the flange 1121 can defines a plurality of recessed structures that match fingers of a human hand, which is convenient for the grabbing of the first connecting bracket 10.

The connecting body 11 further defines a plurality of guiding holes 117 on the second side 1102. The guiding post 12 is inserted into at least one of the guiding holes 117, which can guide the second circuit board 202 when the second circuit board 202 is fixed to the connecting body 11. In at least one embodiment, the guiding holes 117 are arranged at different intervals. The guiding post 12 can be selectably inserted into at least one of the guiding holes 117, thereby matching different second circuit boards 202 of different sizes. In at least one embodiment, the guiding post 12 is threadedly connected to the guiding hole 117.

In at least one embodiment, the connecting body 11 further defines two fixing holes 116 on the second side 1102. The fixing holes 1102 are located on both sides of the guiding holes 117, and can fix the second circuit board 202 on the connecting body 11.

The connecting body 11 includes at least four mounting portions 113 and at least four fixing portions 114. Two of the mounting portions 113 extends from the inner wall of the opening 112 away from the flange 1121. That is, the mounting portions 113 and the flange 1121 are positioned at opposite sides of the opening 112. The mounting portion 113 can be used to fix the adapter plate 203 such as by screws. Other two of the mounting portions 113 extend from opposite edges of the second surface 1104. The extending direction of the mounting portions 113 can be perpendicular to the second surface 1104. The mounting portions 113 and the connecting body 11 can be integrally formed.

The fixing portion 114 is disposed on the first side 1101 of the connecting body 11. The fixing portion 114 fixes the first connecting bracket 10 to the first circuit board 201. In at least one embodiment, the fixing portion 114 is substantially Z-shaped, which includes a connecting piece 1141, an extension piece 1142, and a fixing piece 1143. The connecting piece 1141 and the fixing piece 1143 are substantially parallel to each other. The extension piece 1142 is perpendicular to the connecting piece 1141 and the fixing piece 1143. The fixing member 1143 can be fixed on the first circuit board 201 by screws. The fixing portion 114 only occupies a small area of the first circuit board 201. In at least one embodiment, four fixing portions 114 are included. Two of the fixing portions 114 are fixed to the connecting body 11 by studs (not shown) to increase the stability of connection between the fixing portion 114 and the connecting body 11. The other two of the fixing portions 114 are connected to the connecting body 11 through two extension portions 115. The extension portions 115 are fixed on both sides of the connecting body 11, and is a substantially triangular for increasing the stability of the connection between the connecting body 11 and the first circuit board 201.

The structure of the second connecting bracket 20 is the same as the structure of the first connecting bracket 10. When in use, the first connecting bracket 10 and the second connecting bracket 20 are opposite to each other.

The grabbing member 30 is approximately fixed on a middle of the second circuit board 202. In at least one embodiment, the extension directions of the grabbing member 30 is substantially parallel to that of the adapter plate 203. The grabbing member 30 can provide a position for grabbing the second circuit board 202, so that the second circuit board 202 can be installed on the adapter board 203 or detached from the adapter board 203. In at least one embodiment, an auxiliary plate 31 is provided on both sides of the grabbing member 30, thus the grabbing member 30 has a frame structure. Thus, an area for grabbing the grabbing member 30 increases, which facilitates the grabbing of the grabbing member 30. In at least one embodiment, In at least one embodiment, two grabbing members 30 are included, which are convenient for two-hand control.

When in use, the four adapter plates 203 are fixed between the first connecting bracket 10 and the second connecting bracket 20 by screws. Each adapter board 203 is then inserted into the first slot 2010 of the first circuit board 201. The first connecting bracket 10 and the second connecting bracket 20 are fixed on the first circuit board 201 through the fixing portion 114. Then, the grabbing member 30 is mounted on the second circuit board 202. The position of the guiding post 12 is adjusted according to the second circuit board 202. The second circuit board 202 is inserted into the guiding post 12, and is fixed to the first connecting bracket 10 and the second connecting bracket 20 through the fixing holes 116.

With the above configuration, the first connecting bracket 10 and the second connecting bracket 20 only occupy a small area on the circuit board. By defining the openings 112 on the first connecting bracket 10 and the second connecting bracket 20 and then adding the grabbing member 30, the installation and detachment of the first circuit board 201 and the second circuit board 202 are facilitated, and damages to the circuit boards can be avoided. The guiding post 12 can guide the second circuit board 202 during the installation of the second circuit board 202, and an installation error that may cause a loss to the circuit board is avoided.

Figure 5:
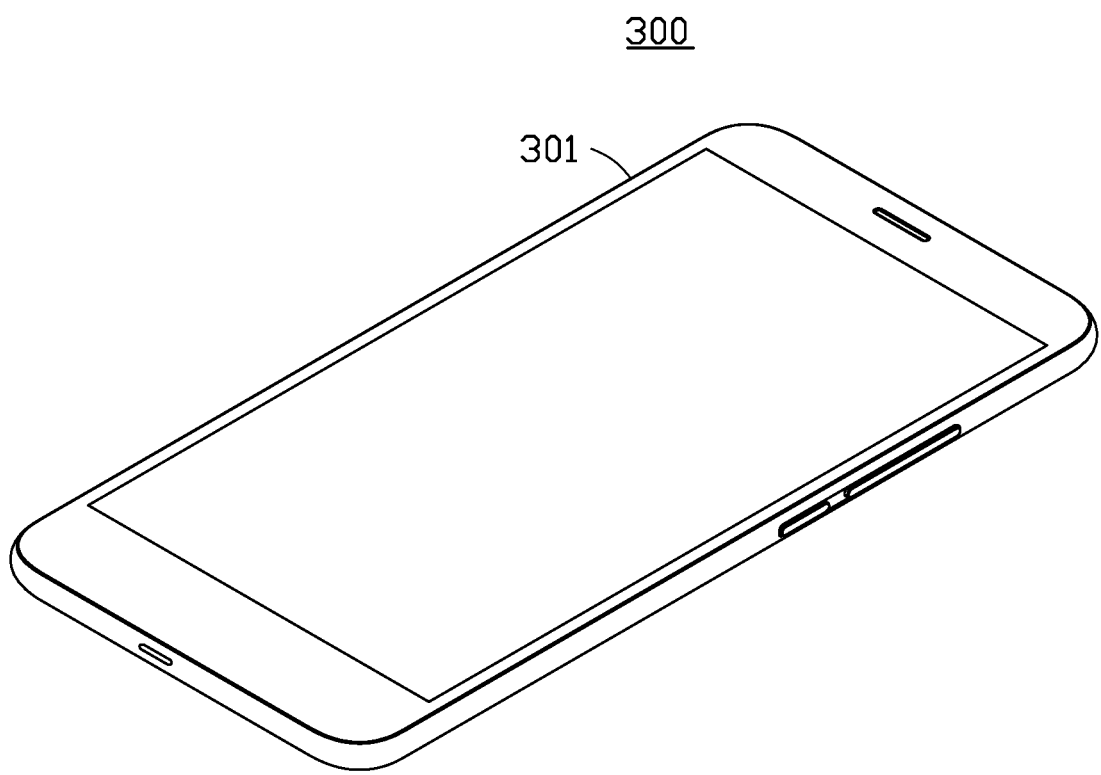
FIG. 5 is a diagrammatic view of an embodiment of an electronic device according to the present disclosure.
Figure 6:
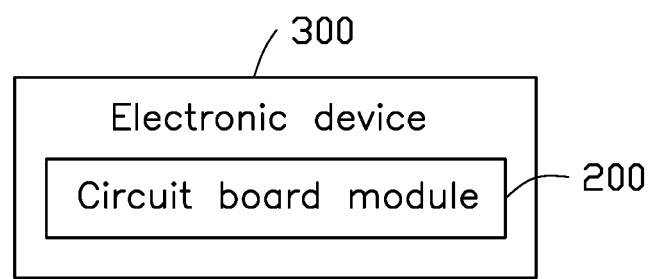
FIG. 6 is a block diagram of the electronic device of FIG. 5.

FIGS. 5 and 6 illustrate an embodiment of an electronic device 300 including a casing 301 and the circuit board module 200. The first circuit board 201 of the circuit board module 200 is fixed to the casing 301.

Since the electronic device 300 can fix the adapter boards 203 between the first circuit board 201 and the second circuit board 202, and a large amount of data transmission can be realized.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A circuit board module, comprising:
a first circuit board;
a second circuit board facing the first circuit board;
a connecting device fixed between the first circuit board and the second circuit board; and
an adapter board fixed to the connecting device and disposed between the first circuit board and the second circuit board, the adapter board being inserted into the first circuit board and the second circuit board;
wherein the connecting device comprises a first connecting bracket and a second connecting bracket, each of the first connecting bracket and the second connecting bracket further comprises a first surface and a second surface opposite to the first surface, the first surface is recessed towards the second surface to form a recess region, and a bottom of the recess region defines an opening that penetrating the second surface, a flange extends from an inner wall of the opening on the recess region towards the first surface.

2. The circuit board module of claim 1, wherein each of the first connecting bracket and the second connecting bracket comprises a first side and a second side opposite to the first side, the first side is fixed to the first circuit board, and the second side is fixed to the second circuit board.

3. The circuit board module of claim 2, wherein the connecting device further comprises a grabbing member mounted on the second circuit board.

4. The circuit board module of claim 3, wherein an auxiliary plate is provided on two sides of the grabbing member.

5. The circuit board module of claim 2, wherein the second side of each of the first connecting bracket and the second connecting bracket defines at least one guiding hole, at least one guiding post is movably inserted into the at least one guiding hole, and the at least one guiding post is inserted into the second circuit board.

6. The circuit board module of claim 2, wherein at least two guiding holes are defined on the second side, the guiding holes are arranged at different intervals.

7. The circuit board module of claim 2, wherein each of the first connecting bracket and the second connecting bracket further comprises a fixing portion configured for fixing the first connecting bracket or the second connecting bracket on the first circuit board.

8. The circuit board module of claim 1, wherein each of the first connecting bracket and the second connecting bracket further comprises a mounting portion to fix the adapter board.

9. The circuit board module of claim 8, wherein the mounting portions extends from the inner wall of the opening away from the flange.

10. An electronic device, comprising:
a casing;
a circuit board module, comprising:
  a first circuit board fixed to the casing;
  a second circuit board facing the first circuit board;
  a connecting device fixed between the first circuit board and the second circuit board; and
an adapter board fixed to the connecting device and disposed between the first circuit board and the second circuit board, the adapter board being inserted into the first circuit board and the second circuit board;
wherein the connecting device comprises a first connecting bracket and a second connecting bracket, each of the first connecting bracket and the second connecting bracket further comprises a first surface and a second surface opposite to the first surface, the first surface is recessed towards the second surface to form a recess region, and a bottom of the recess region defines an opening that penetrating the second surface, a flange extends from an inner wall of the opening on the recess region towards the first surface.

11. The electronic device of claim 10, wherein each of the first connecting bracket and the second connecting bracket comprises a first side and a second side opposite to the first side, the first side is fixed to the first circuit board, and the second side is fixed to the second circuit board.

12. The electronic device of claim 11, wherein the connecting device further comprises a grabbing member mounted on the second circuit board.

13. The electronic device of claim 12, wherein an auxiliary plate is provided on two sides of the grabbing member.

14. The electronic device of claim 11, wherein the second side of each of the first connecting bracket and the second connecting bracket defines at least one guiding hole, at least one guiding post is movably inserted into the at least one guiding hole, and the at least one guiding post is inserted into the second circuit board.

15. The electronic device of claim 10, wherein each of the first connecting bracket and the second connecting bracket further comprises a mounting portion configured for fixing the adapter board.

16. The electronic device of claim 15, wherein the mounting portions extends from the inner wall of the opening away from the flange.

* * * * *